US009208268B2

United States Patent
Fung

(10) Patent No.: US 9,208,268 B2
(45) Date of Patent: Dec. 8, 2015

(54) GIGA-CELL LINEAR SOLVER METHOD AND APPARATUS FOR MASSIVE PARALLEL RESERVOIR SIMULATION

(71) Applicant: Saudi Arabian Oil Company, Dhahran (SA)

(72) Inventor: Larry Siu-Kuen Fung, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 475 days.

(21) Appl. No.: 13/765,361

(22) Filed: Feb. 12, 2013

(65) Prior Publication Data

US 2013/0211800 A1 Aug. 15, 2013

Related U.S. Application Data

(60) Provisional application No. 61/598,633, filed on Feb. 14, 2012.

(51) Int. Cl.
    G06G 7/48      (2006.01)
    G06F 17/50     (2006.01)
    G01V 99/00     (2009.01)

(52) U.S. Cl.
    CPC ............ *G06F 17/5009* (2013.01); *G01V 99/00* (2013.01)

(58) Field of Classification Search
    CPC ......... E21B 49/00; E21B 43/00; G01V 11/00; G06F 2217/16; G06F 17/5018
    USPC .......................................................... 703/10
    See application file for complete search history.

(56) References Cited

U.S. PATENT DOCUMENTS

| 5,321,612 | A * | 6/1994 | Stewart .......................... 702/13 |
| 7,596,480 | B2 | 9/2009 | Fung et al. |
| 7,684,967 | B2 | 3/2010 | Wallis et al. |
| 7,822,289 | B2 | 10/2010 | Szeliski |
| 2006/0265204 | A1 | 11/2006 | Wallis et al. |
| 2010/0082509 | A1 | 4/2010 | Mishev et al. |
| 2010/0082724 | A1 | 4/2010 | Diyankov et al. |
| 2011/0098998 | A1 | 4/2011 | Lunati et al. |
| 2011/0191080 | A1 | 8/2011 | Klie |

FOREIGN PATENT DOCUMENTS

WO    2012015500 A1    2/2012

OTHER PUBLICATIONS

Dogru et al. "A Next-Generation Parallel Reservoir Simulator for Giant Reservoirs" 2009 SPE Reservoir Simulation Symposium, Society of Petroleum Engineers, SPE 119272, The Woodlands, Texas, Feb. 2-4, 2009, pp. 1-29.

(Continued)

*Primary Examiner* — Saif Alhija
(74) *Attorney, Agent, or Firm* — Bracewell & Giuliani LLP; Constance G. Rhebergen; Albert B. Kimball, Jr.

(57) ABSTRACT

A linear solver methodology is applied to reservoir data to solve for large system of equations arising from high-resolution reservoir simulation of giant oil fields with minimal upscaling using either structured grids or unstructured grids. Full geologic complexity and discontinuities at the resolution desired for accurate simulation results may be taken into account. A general unstructured method is provided, so that very complex flow geometry near multi-lateral wells can be modeled.

21 Claims, 8 Drawing Sheets

(56) References Cited

OTHER PUBLICATIONS

Fung et al. "Distributed Unstructured Grid Infrastructure for Complex Reservoir Simulation" 2008 SPE Europec/EAGE Annual Conference and Exhibition, SPE 113906, Rome, Italy, Jun. 9-12, 2008, pp. 1-9.

Fung et al. "Efficient Multilevel Method for Local Grid Refinement for Massively Parallel Reservoir Simulation" Proceedings of the European Conference of Mathematics of Oilrecovery M-28, Jan. 1, 2000, 8 pgs.

Giraud et al. "Parallel scalability study of hybrid preconditioners in three dimensions" Parallel Computing, Elsevier Publishers, Amsterdam, NL, vol. 34, No. 6-8, Jul. 1, 2008, pp. 363-379.

International Search Report and Written Opinion, PCT/US2013/026019, mailed Nov. 5, 2013.

White et al. "Block-preconditioned Newton-Krylov solvers for fully coupled flow and geomechanics" Computational Geosciences, Kluwer Academic Publishers, DOI, vol. 15, No. 4, Apr. 12, 2011, pp. 647-659.

\* cited by examiner

GIGA-CELL LINEAR SOLVER METHOD AND APPARATUS FOR MASSIVE PARALLEL RESERVOIR SIMULATION

CROSS REFERENCE TO RELATED APPLICATIONS

This application claims priority from U.S. Provisional Application No. 61/598,633, filed Feb. 14, 2012. For purposes of United States patent practice, this application incorporates the contents of the Provisional Application by reference in entirety.

BACKGROUND OF THE INVENTION

1. Field of the Invention

The present invention relates to computerized simulation of what are known as giant reservoirs.

2. Description of the Related Art

In the oil and gas industries, the development of large underground hydrocarbon reservoirs often requires the building of computer simulation models. These underground hydrocarbon reservoirs are often complex rock formations which contain fluids in the form of petroleum fluid mixtures and water, which exist in two or more fluid phases. During production, the petroleum mixture is produced by wells drilled into and completed in these rock formations. Sometimes, fluids such as water and/or gases are also injected into these rock formations to improve the recovery of the petroleum fluids. Oil and gas companies have come to depend on reservoir simulation as an essential tool to enhance their ability to exploit their petroleum reserves.

Reservoir simulation belongs to the general domain of flow in porous media simulation. However, reservoir simulation normally involves multiple hydrocarbon components and multiple fluid phases in an underground geological formation which is under high pressure and temperature. The chemical phase behavior of these hydrocarbon fluids and the included groundwater has to be taken into account in these simulators.

The simulation models contain the data which describe the specific geometry of the rock formations and the wells, the fluid and rock property data, as well as production and injection history pertaining to the specific reservoirs of the oil or gas field in question. The simulation models are formed by a simulator (known as a reservoir simulator) which is a suite of computer programs run on a data processing system. The reservoir simulator which runs these models is a computer implemented numerical methodology, or coded algorithms and data constructs of an underlying mathematical model. The mathematical model which represents the physics of fluid movements in these hydrocarbon reservoirs is a system of nonlinear partial differential equations which describe the transient multiple-phase, multiple-component fluid flow and material balance behaviors in these reservoirs induced by the production and/or injection of fluids, as well as the pressure-volume-temperature (PVT) relationships of the reservoir fluids.

A reservoir simulator simulates the multiphase multicomponent fluid flow and material balance in subterranean reservoirs and the included surrounding porous rock formations by subdividing the volume into contiguous cells known as grid blocks. A grid block is the basic finite volume where the underlying mathematical model is applied. The number of grid blocks varies depends on the resolution needed for the simulation and the size of the reservoirs in question. For a large reservoir, such as the type known in the industry as a giant reservoir, which may have multi-billion barrels of original oil-in-place (OOIP), the number of grid cells can be in the hundreds of millions to over a billion, in order to have adequate resolution to represent flow dynamics, formation rack porosity and permeability heterogeneity, and many other geologic and depositional complexities within the reservoir. Simulation of this size reservoir can be termed giga-cell reservoir simulation.

Depending on the depositional history of the reservoir layering and the subsequent geological or erosional processes which shaped it, the geometries of the rock layering and hence the description of the grid cells can be very complex. FIG. 1 is a schematic diagram of a typical structural grid G using what is known as corner-point-geometry (CPG) description. The geometric description of grid cells often contains discontinuities such as faults and fractures, pinch-outs and shale barriers. These discontinuities lead to an unstructured cell connectivity requirement even for reservoir simulation models which use a structured grid, such as shown in FIG. 1. These irregularities are known as non-neighbor connections.

Geologic complexity is one driver for reservoir simulation to use unstructured cell connectivities where the flow geometry can be more accurately represented. FIG. 2A is a display of a portion of an example of what is known as an unstructured PEBI grid U for a reservoir of interest with a number of multilateral wells 20 indicated at their respective locations in the reservoir. FIG. 2B is an enlarged view of a portion of FIG. 2A indicated by reference numeral 22. As can be seen in FIG. 2B, the discretization of the grid cells in the vicinity of the multilateral wells 20 in the unstructured grid U honors the local flow geometry rather than being structured and rectilinear as in the case of the structured grid G of FIG. 1.

Another driver is thus the complex well geometry as typical wells drilled today are either horizontal or multilateral wells strategically positioned to maximize reservoir contacts and hydrocarbon recovery. Grids such as those of FIGS. 2A and 2B which honor local flow directions near the wells provide better numerical accuracy. Modern reservoir simulators require solver methodology to be able to address the irregular inter-cell connections. This leads to the requirement to solve large spare linear systems involving general unstructured matrices.

Accurate near-well flow modeling and the modeling of cross-flow is another important aspect in modern reservoir simulation. The solver utilized must include fully-implicit fully-coupled well modeling with the reservoir system in order for the simulation to be accurate and robust. The fully coupled solution must also be fast and scalable in the context of massive parallelism in the computation.

The transient solution of the multiphase multicomponent system involves the evolution of mass and energy conservation in a sequence of time steps from the initial condition of the reservoir. For each time step, the system of nonlinear discrete equations for each finite volume is linearized using what is known as the generalized Newton's method. A general species conservation equation for the component i is given by:

$$\frac{\partial c_i}{\partial t} + \nabla \cdot \sum_{j=1}^{n_p}\left(\rho_j \omega_{ij} u_j - \phi \rho_j S_j \vec{D}_{ij} \cdot \nabla \omega_{ij}\right) = \tag{1}$$

$$\phi \sum_{j=1}^{n_p}(S_j R_{ij}) + (1-\phi)R_{is} + \dot{q}_i$$

where $$c_i = \phi \sum_{j=1}^{n_p} \rho_j \omega_{ij} S_j + (1-\phi)\rho_s \omega_{is} \tag{2}$$

If dispersion, chemical reaction and absorption are ignored, the species equation simplifies to:

$$\frac{1}{V_b}\frac{\partial n_i^t}{\partial t} + \nabla \cdot \sum_{j=1}^{n_p}(\rho_j x_{ij} u_j) = \dot{q}_i \tag{3}$$

Since the pore space of porous medium must be filled with fluids present, the pore volume must be equal to the total fluid volume. This can be expressed as:

$$\sum_{i=1}^{n_p} V_j = V_\phi \tag{4}$$

where the pore volume $V_\phi$ is a function of pressure alone and described as:

$$V_\phi = V_\phi^{ref} e^{C_r(p^{ref}-P)} \tag{5}$$

Pressure and the overall number of moles are the primary variables. For closure, the other equations used are:

Constraint on mole fractions for each phase: $\sum_{i=1}^{n_c} x_{ij} = 1$ (6)

Constraint on total moles per component $\sum_{j=1}^{n_p} n_j^p x_{ij} = n_i^t$ (7)

Constraint on fluid saturations $\sum_{j=1}^{n_p} S_j = 1$ (8)

wherein $S_j = \dfrac{V_j}{\sum_{j=1}^{n_p} V_j}$ (9)

and $V_j = \dfrac{n_j^p}{\rho_j}$ (10)

Phase velocities are described by Darcy's Law:

$$u_j = -K\lambda_j(\nabla P_j - \gamma_j \nabla D) \tag{11}$$

where K is the permeability tensor defined as:

$$K = \begin{bmatrix} k_{xx} & k_{xy} & k_{xz} \\ k_{yx} & k_{yy} & k_{yz} \\ k_{zx} & k_{zy} & k_{zz} \end{bmatrix} \tag{12}$$

The symbols in the above equations have these meanings:

| Symbol | |
|---|---|
| p | pressure |
| q | production rate |
| $x_i$ | Mole fraction |
| $V_j$ | Phase Volume |
| $S_j$ | Phase Saturation |
| $c_i$ | Overall Concentration of species i |
| $\phi$ | porosity |
| $\rho$ | density |
| $\mu$ | viscosity |
| $\omega$ | mass fraction |
| R | Homogeneous reaction rate |
| D | Dispersion Coefficient |
| u | velocity |
| $V_\phi$ | Rock pore volume |
| $n_i^t$ | Overall number of mole |

| Subscripts | |
|---|---|
| i | component index |
| j | phase index |

| Superscripts: | |
|---|---|
| ref | reference |
| p | a fluid phase |
| t | total |

In the industry, this is referred to as Newtonian iteration or nonlinear iteration. At each Newtonian iteration, a linear system of equations is constructed where the matrix, known as the Jacobian matrix, and the right-hand-side vector, known as the residuals are used to solve for the changes in the primary variables of the system.

Current industry practice for solving the linear system of equations is via a preconditioned iterative method. The iterative algorithm can be one of three forms: one known as the ORTHOMIN; the second known as the GMRES, or the third known as the BICGSTAB method. For robustness, the preconditioner used, rather than the choice of the iterators, has been more important. Typical state-of-the-art preconditioners used in the reservoir simulation industry can be the one-level preconditioner such as the nested factorization (NF) method, or variants of the incomplete LU factorization (ILU) method. These are widely practiced in today's commercial simulators.

More recent practice involves the use of multi-stage preconditioning. The nature of the governing equations in reservoir simulation is mixed parabolic-hyperbolic. For treating the parabolic part of the system, the multi-level algebraic multigrid (AMG) or geometric multigrid (GMG) can be very effective if the pressure components of the original problem are first decoupled from the full system via what is known as the constraint pressure residual (CPR) algorithm. The approximate pressure problem can be attacked effectively via a multi-level method such as AMG or GMG. The remaining hyperbolic component of the residuals can be readily dealt with using a suitable and cheaper one-level preconditioner. This in effect is what is known as a divide-and-conquer preconditioning strategy, and is known in the art. However, the GMG multi-level method cannot, so far as is known, handle non-neighbor connections. Thus, the AMG method is the generalized multi-level method typically used to accommodate realistic simulation problems.

The measure of efficiency of a computational processing algorithm in parallel computing is its scalability. A method is perfectly scalable, or has a 100 percent parallel efficiency, if it takes one hour to solve a computational problem on the computer with a single CPU, and then if the work is exactly divided out and given to two CPU's, the time to solve the same problem is 0.5 hour, and the time to solve the same problem using four CPU's is 0.25 hour and so on. That is, there is no parallelization overhead. A perfectly scalable method would be an ideal situation. In reality, many reasons can cause the solution time on a real system to be far from this ideal.

The practices or strategies described above work very well for serial computing, using a single core of a single CPU, and for small scale parallelism using tens of CPU cores. However, they suffer significant loss of parallel scalability as the number of processes increases. This is because the nested factorization (NF) and incomplete LU factorization (ILU) described above have significant recursive components which cannot be easily parallelized. In addition, multi-level methods such as algebraic multigrid (AMG) incur significant communication overhead in the aggregation and smoothing at coarsened grid levels which reduces parallel scalability.

Increasingly, simulation models of reservoirs and oil/gas fields have become more large and complex. At the same time, computer hardware has evolved rapidly to become inexpensive and fast. The current trend for hardware evolution is towards massive parallelism: from high performance computing or HPC system with single-core CPU's in the recent past, to currently used PC clusters composed of thousands of multi-core CPU's, to the recent advent of the heterogeneous CPU-GPU system. Simulation practitioners can now use inexpensive hardware with tens of thousands of compute cores working concurrently to solve a large-scale simulation problem.

So far as is known, existing solver methods did not handle giga-scale reservoir simulation due to poor scalability issues and/or robustness issues. Presently available solver methodology is limited to about ten million grid cells and parallel scalability in the tens of processes. Without massively parallel scalability, a simulation run for a history match simulation or a prediction simulation becomes too slow and impractical. This limits the size of the models which can be used in flow simulation. For the large reservoirs, this means excessive upscaling.

Several other factors about the reservoir further increased the complexity of giga-scale reservoir simulation. The treatment of common geologic discontinuities such as fractures, faults, pinch-outs, and shale barriers posed difficulties for robust scalable solver methods. The complex flow geometry near multilateral wells was not accurately modeled using structured grids. Unstructured grids required specialized unstructured methods and made the computational load harder to balance among processors and harder to solve robustly and efficiently.

Also, the fully-coupled fully-implicit well solution is a required method for accurate reservoir simulation. This is another factor which can degrade scalability, especially when the reservoir contains thousands of complex multilateral wells. Further, many petroleum reservoir rocks have multi-modal porosity-permeability and multi-scale fracture networks.

SUMMARY OF THE INVENTION

Briefly, the present invention provides a new and improved computer implemented method in simulation of fluid characteristics of a subsurface reservoir with a reservoir simulator. The fluid characteristics are governed by fluid flow, material balance and pressure-volume-temperature relationships. The reservoir is partitioned into a number of subdomains, each subdomain representing a finite volume of the reservoir containing multiphase, multicomponent fluids and being organized into a group of grid cells having data regarding the fluids. The reservoir simulation is performed in a cluster computer formed of at least one master node and a plurality of processor nodes, with each processor node being assigned a subdomain of the partitioned reservoir. The computer implemented method according to the present invention simulates by Newtonian iterations fluid characteristics parameters of interest for the grid cells and is composed of a sequence of computer implemented steps. The data for each of the reservoir subdomains are arranged into a Newtonian matrix A composed of: a matrix P composed of the block diagonal of the subdomain and non-zero data blocks adjacent the block diagonal, a matrix E composed of non-zero data blocks not included in the block diagonal matrix P. The matrix E is composed of a matrix E' of interior grid blocks within the subdomain and a matrix E" of boundary grid cell blocks with grid cells of adjacent subdomains in the reservoir. Parallel approximate solutions of the fluid characteristics for the grid blocks of each of the subdomains are performed in the assigned processor nodes using a chosen local preconditioner for the subdomain. Full system residuals for the Newtonian matrix for the reservoir are updated based on the parallel approximate solutions. The full system residuals are restricted into a global reduced space according to a global reduced space matrix. A parallel approximate solution of the full system residuals is performed using a global reduced space preconditioner. A combined approximate solution update is then performed in the assigned processor nodes of the parallel approximate solutions of each of the subdomains and the parallel approximate solution of the full system residuals to form a solution vector. The full system residuals are updated using the solution vector. An iterative solver is applied to the full system to obtain measures of the fluid characteristics for the grid cells of the reservoir. The measures of the fluid characteristics obtained by applying the iterative solver are tested to determine if convergence is achieved. If convergence is not achieved, processing returns to performing parallel approximate solutions. If convergence is achieved, processing returns to the reservoir simulator.

The present invention further provides a new and improved data processing system for simulation of fluid characteristics of a subsurface reservoir with a reservoir simulator. The data processing system includes a cluster computer formed of at least one master node and a plurality of processor nodes. The fluid characteristics of the reservoir are governed by fluid flow, material balance and pressure-volume-temperature relationships, and the reservoir is partitioned into a number of subdomains. Each subdomain represents a finite volume of the reservoir containing multiphase, multicomponent fluids and being organized into a group of grid cells having data regarding the fluids. Each processor node of the data cluster computer is assigned a subdomain of the partitioned reservoir. The cluster computer simulates by Newtonian iterations fluid characteristics parameters of interest for the grid cells. Processors in the data processing system operate in a processing sequence of computer implemented steps. The data for each of the reservoir subdomains are arranged into a Newtonian matrix A composed of: a matrix P composed of the block diagonal of the subdomain and non-zero data blocks adjacent the block diagonal, a matrix E composed of non-zero data blocks not included in the block diagonal matrix P. The matrix E is composed of a matrix E' of interior grid blocks within the subdomain and a matrix E" of boundary grid cell blocks with grid cells of adjacent subdomains in the reservoir. Parallel approximate solutions of the fluid characteristics for the grid blocks of each of the subdomains are performed in the assigned processor nodes using a chosen local preconditioner for the subdomain. Full system residuals for the Newtonian matrix for the reservoir are updated based on the parallel approximate solutions. The full system residuals are restricted into a global reduced space according to a global reduced space matrix. A parallel approximate solution of the full system residuals is performed using a global reduced space preconditioner. A combined approximate solution update is then performed in the assigned processor nodes of the parallel approximate solutions of each of the subdomains and the parallel approximate solution of the full system residuals to form a solution vector. The full system residuals are updated using the solution vector. An iterative solver is applied to the full system to obtain measures of the fluid characteristics for the grid cells of the reservoir. The measures of the fluid characteristics obtained by applying the iterative solver are tested to determine if convergence is achieved. If convergence is not achieved, processing returns to performing parallel approximate solutions. If convergence is achieved, processing returns to the reservoir simulator.

The present invention further provides a new and improved data storage device having stored in a computer readable medium computer operable instructions for causing a data processing system to simulate fluid characteristics of a subsurface reservoir. The fluid characteristics are governed by fluid flow, material balance and pressure-volume-temperature relationships, and the reservoir is partitioned into a number of subdomains. Each subdomain represents a finite volume of the reservoir containing multiphase, multicomponent fluids and is organized into a group of grid cells having data regarding the fluids. The data processing system includes a cluster computer formed of at least one master node and a plurality of processor nodes, with each processor node being assigned a subdomain of the partitioned reservoir. The data processing system further simulates by Newtonian iterations fluid characteristics parameters of interest for the grid cells. The data storage device contains instructions for causing the data processing system operate in a processing sequence, as follows. The data for each of the reservoir subdomains are arranged into a Newtonian matrix A composed of: a matrix P composed of the block diagonal of the subdomain and non-zero data blocks adjacent the block diagonal, a matrix E composed of non-zero data blocks not included in the block diagonal matrix P. The matrix E being composed of a matrix E' of interior grid blocks within the subdomain and a matrix E" of boundary grid cell blocks with grid cells of adjacent subdomains in the reservoir. Parallel approximate solutions of the fluid characteristics for the grid blocks of each of the subdomains are performed in the assigned processor nodes using a chosen local preconditioner for the subdomain. Full system residuals for the Newtonian matrix for the reservoir are updated based on the parallel approximate solutions. The full system residuals are restricted into a global reduced space according to a global reduced space matrix. A parallel approximate solution of the full system residuals is performed using a global reduced space preconditioner. A combined approximate solution update is then performed in the assigned processor nodes of the parallel approximate solutions of each of the subdomains and the parallel approximate solution of the full system residuals to form a solution vector. The full system residuals are updated using the solution vector. An iterative solver is applied to the full system to obtain measures of the fluid characteristics for the grid cells of the reservoir. The measures of the fluid characteristics obtained by applying the iterative solver are tested to determine if convergence is achieved. If convergence is not achieved, processing returns to performing parallel approximate solutions. If convergence is achieved, processing returns to the reservoir simulator.

DETAILED DESCRIPTION OF THE PREFERRED EMBODIMENTS

Figure 1:
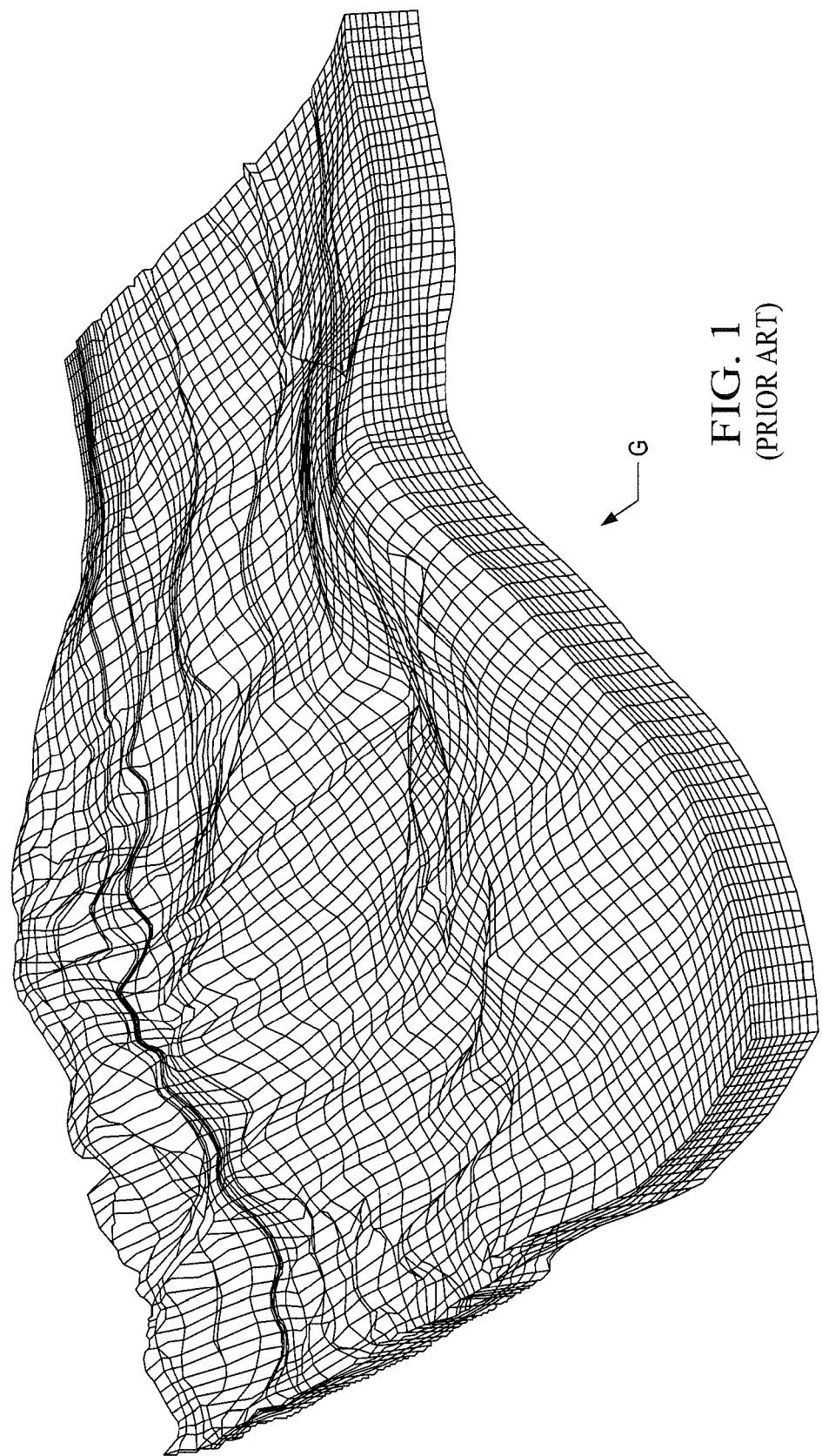
FIG. 1 is an isometric view of a model of a typical structured grid of a subsurface reservoir.
Figure 2A:
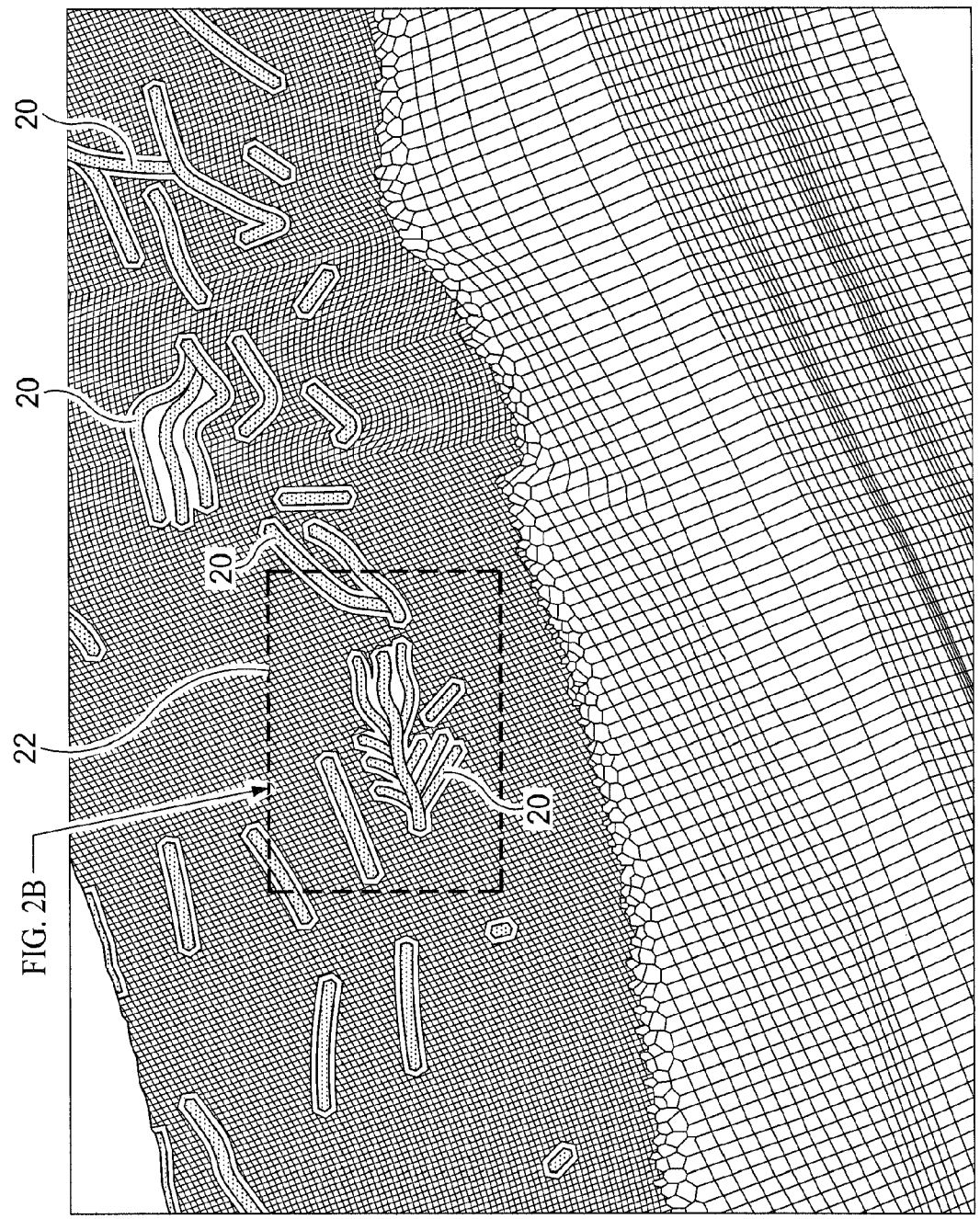
FIGS. 2A and 2B are displays of example of typical unstructured grids of a subsurface reservoir.
Figure 2B:
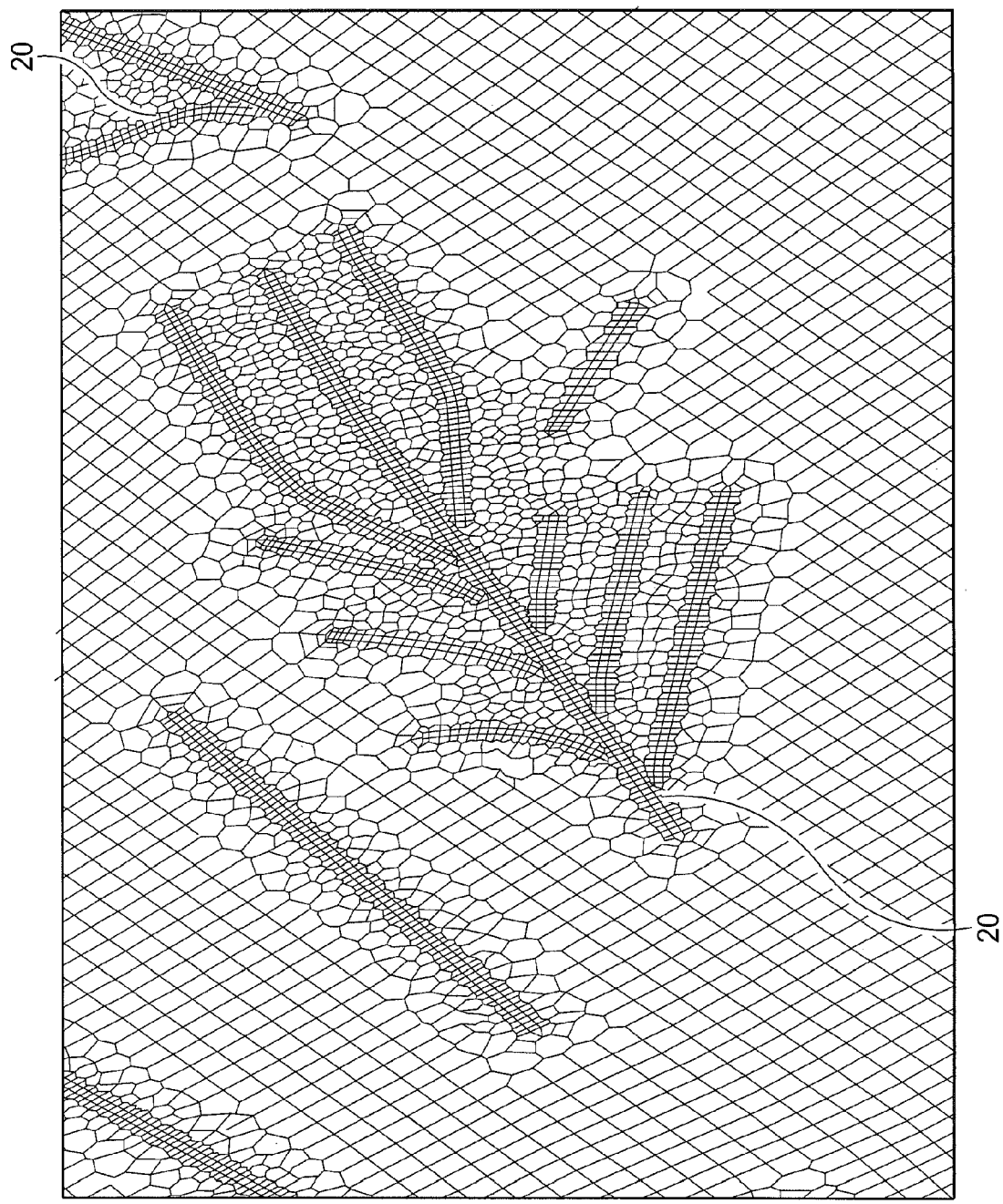

With the present invention, a multi-stage preconditioning in massive parallel reservoir simulation which is highly scalable is provided. The governing nonlinear partial differential equations solved by reservoir simulation with the present invention are the discrete mass, momentum, and energy balances written for the transient multi-phase multi-component fluid flow for interconnected finite volumes which are known as grid cells. For what are known as giant reservoirs, the number of grid cells can be several millions to over a billion. In addition, a simulation model can contain several reservoirs. The reservoirs may also be connected hydraulically via communicating aquifers and/or subterranean fracture systems in surrounding geologic formation and strata. The reservoirs may also be connected via multi-lateral wells drilled into the different formation for comingling production or injection processes.

While the processing methodology is competitive, robust, and offers superior scalability for models which have only a few million grid cells, the present invention particularly targets large system solution which require robust and yet highly scalable preconditioner to effectively solve the problem. So far as is known, the prior art does not adequately address the issue of parallel scalability requirements and thus suffers from a significant loss of parallel performance for large-scale application.

A technique known as the general Newton-Raphson method is used to generate the system equations of the form [A]{v}={R} where [A] represents the system Jacobian matrix, {v} represents the update solution vector and {R} represents the residual vector. The present invention relates to the solver method once the system matrix [A] and the residual vector {R} have been generated. A single simulation with several years of history match and/or future performance prediction typically requires a few hundreds to thousands of time steps, and each time step requires a number of Newton-Raphson iterations, and each of the Newton-Raphson iterations will require a number of solver iterations to converge the system to within acceptable tolerances.

To solve a large-scale simulation model on a high-performance computing (HPC) cluster composed of hundreds of compute nodes, with each compute node formed of multiple CPUs and each CPU composed of multiple cores, the model is necessarily subdivided into groupings or chunks of grid cells called subdomains. Each subdomain is composed of a subset of contiguous grid cells of the solution domain, and with each subdomain performing a nearly equal amount of computational work. For a large model, it may be necessary to divide the domain into thousands or tens of thousands of subdomains. Parallel computation of the data for the subdomains is a divide-and-conquer strategy.

The problem in parallel processing is that the physical phenomena being modeled have global influences, while the subdivision into subdomains does not take the reservoir phenomena into account. So far as is known, subdivision in the past has resulted in significant computational or memory overhead. Thus, the divide-and-conquer strategy was rendered ineffective in terms of reducing processing time.

A successful iterative solver requires a robust preconditioner and many robust preconditioners have significant serial or recursive components which are not easily amendable to parallel implementation. On the other hand, the known highly parallel preconditioners are not very robust. If the global nature of the model cannot be addressed properly, parallel computing is ineffective to accelerate solution due to the significant increase in computational overhead as a result of the parallel partitioning of solution space into subdomains.

As will be set forth, the present invention provides a multi-stage solver methodology which provides the robustness of serial methods, but achieves large-scale parallel efficiency simultaneously. For ease of reference, the methodology provided by the present invention is called the global reduced space preconditioning method. The global reduced space preconditioning method can use many of the known robust serial methods as the local components to construct a robust scalable parallel method amenable to implementation for running on thousands of processing nodes.

For portability, the present invention can be implemented as computer code using standard high level computing languages such as FORTRAN, C or C++ and parallelization using the MPI standard for distributed memory, the OpenMP standard for shared memory, or a mixed paradigm approach of implementation. This allows the implemented system to readily run on a wide variety of HPC hardware platforms. While the present invention demonstrates efficiencies when there are a few millions of the difficult reservoir simulations to solve, systems involving billions of difficult equations are particularly benefited by the present invention.

For a simulation system which is composed of a large number of finite volumes, with each finite volume possibly having a large set of governing equations, it is necessary to distribute the finite volumes onto multiple compute nodes of an HPC cluster in order to have sufficient resources (compute cores and memory) to solve the system efficiently. If the intent is to solve the global problem using N processes, with the rank of the processes identified using the index i, the global number of finite volumes and the associated system of equations are distributed over N processes and each process, i, possesses a subset of the global volumes and set of equations:

$$[A]_i\{v\}_i = \{R\}_i \quad (1)$$

i=1, 2, 3 ... N

This division into subsets is known as domain partitioning. Each subdomain resulting from partition contains roughly an equal amount of computational work such that the work loads are roughly balanced across processes for good parallel scalability. The partition of an ultra-large simulation system into subdomains preserves the need for the work counts on each subdomain to be approximately equal, while at the same time minimizing the requirement to communicate and obtain data from the adjacent domain. For a simulation model which involves single physics and has the same set of conservation equations for each finite volume, the domain partitioning requires that each subdomain contains an equal number of grid cells and that the number of grid cells, on the boundary of the subdomain is minimized.

Since the reservoir simulation system is tightly coupled, a global solution is required in order to have parallel scalability and the efficient solution normally requires significant communication of data among the compute processes in order to reconcile the global nature of the solution space. However, for large scale parallelization, it was previously considered necessary for the number of compute processes to be increased to reduce simulation time. The communication cost is a component of the parallelization overhead which eventually results in a loss of scalability as the subdomain size is decreased.

A situation thus occurs when a further increase in compute processes does not result in a reduction in simulation time. Some well-known robust preconditioning methods for reservoir simulation are recursive with order dependent executions which makes for limited scope for parallel scalability. Nested Factorization (NF) is one example belonging to this class. On the other hand, highly parallel preconditioning methods are not robust and require excessive iterations to converge, or may even fail to converge for difficult problems. Multi-color block Gauss-Seidel (MCBGS) or block Jacobi preconditioners are examples belonging to this class. The methodology of the present invention provides a multi-stage methodology which overcomes these difficulties.

Figure 5:
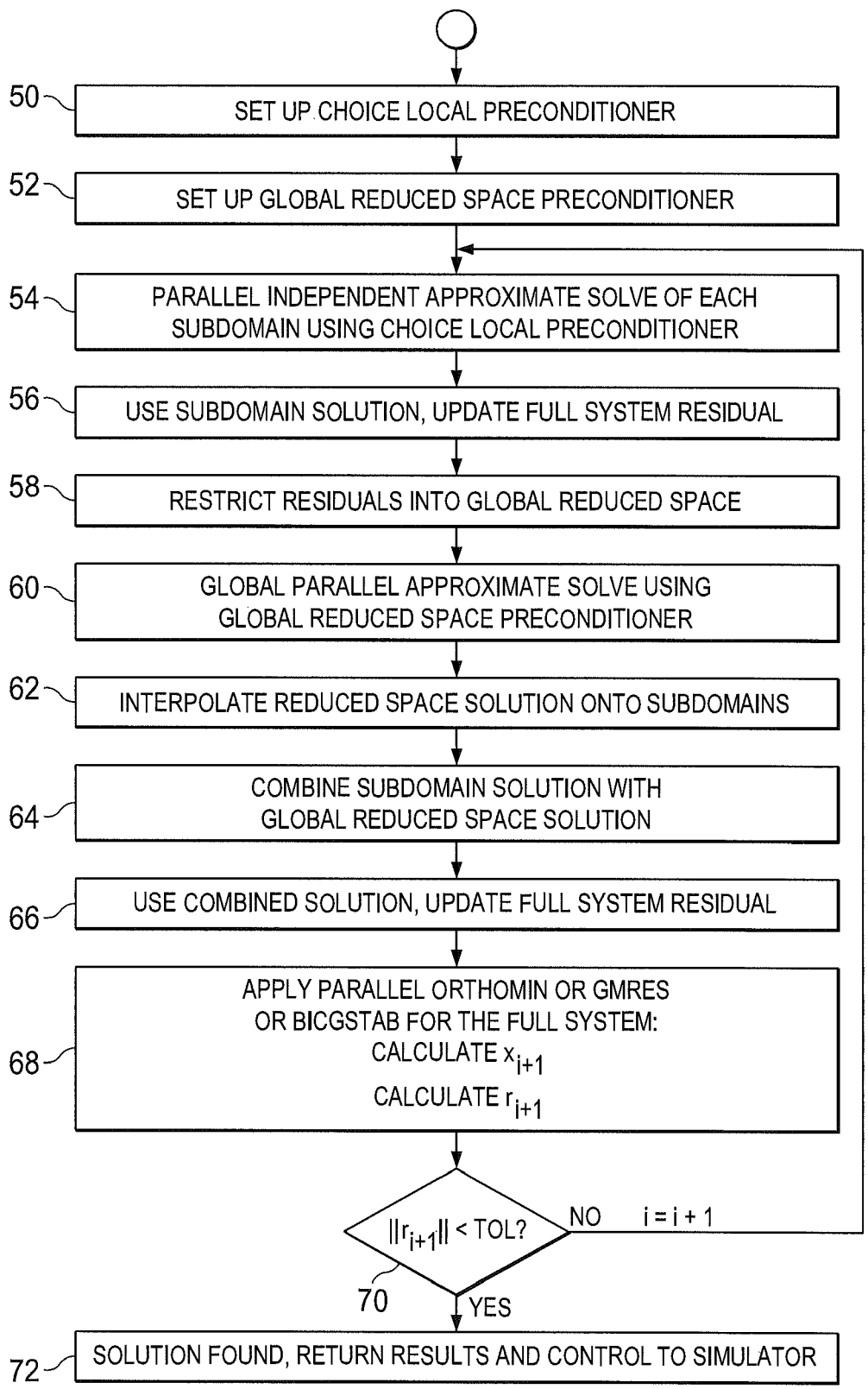
FIG. 5 is a functional block diagram of a set of data processing steps performed in a data processing system for reservoir simulation according to the present invention.
Figure 6:
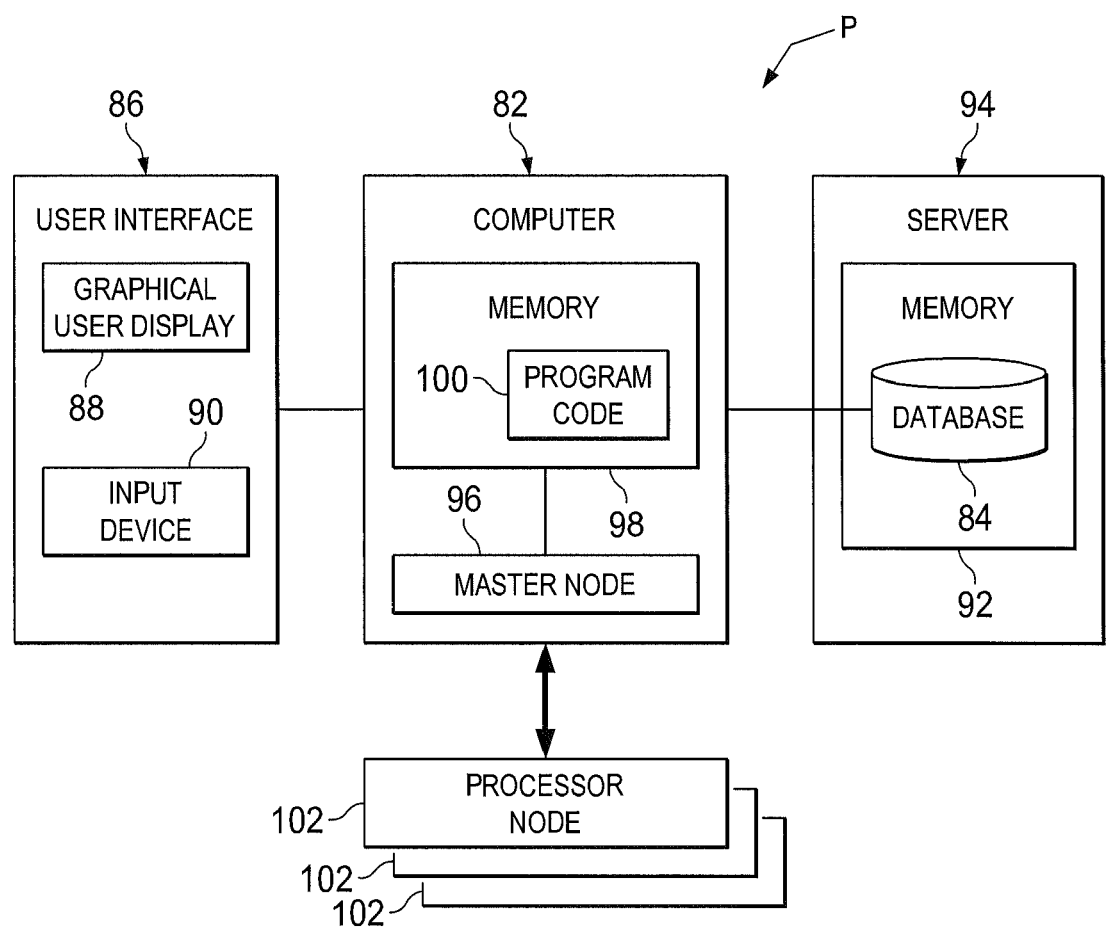
FIG. 6 is a schematic block diagram of a data processing system for reservoir simulation according to the present invention.

A flow chart F FIG. 5 indicates the basic computer processing sequence of the present invention for massively parallel reservoir simulation recording to the present invention in connection with the data processing system P of FIG. 6. During step 50, local preconditioners are selected and set up for the independent subdomains of the reservoir simulation system. The preconditioner set up or chosen for one subdomain precondition may differ from that of other subdomains depending on the nature of the simulation problem for that particular subdomain.

The foundation parallel preconditioner with the present invention is next set up or established during step 52 (FIG. 5). As shown schematically in FIG. 3 the preconditioner of step 52 involves matrix sub-structuring of the grid cells of each of the subdomains of the reservoir into a core sub-matrix [P] and a complement sub-matrix [E] where [A]=[P]+[E]. The [P] matrix is composed of the block diagonal plus other non-zero blocks which are close to the diagonal. The grid cells within a subdomain are reordered such that the largest connection factors are nearest to the diagonal. This ordering strategy is known as the maximum transmissibility ordering.

The width of each block row is variable based on the number nonzero blocks on that row to be included in the [P] matrix for a subdomain. The [E] matrix of a subdomain is composed of the non-zeros which are not included in [P]. This includes parts of the interior grid cell connections [E'] within the subdomain and all of the boundary grid cell connections [E"] with grid cells in its neighboring subdomains.

Since the system matrix [A] is parallel memory distributed, matrix data can be stored during step 52 of FIG. 5 as three lists of block compressed spare row (CSR) for each of the parts [P], [E'], and [E"]. The preconditioner of step 52 can be referred to as the Variable-Block-Row-Line-Solve-Power-Series (VBR-LSPS) Preconditioner and has the mathematic form:

$$A^{-1} \approx M_N^{-1} = \left[I + \sum_{k=1}^{N}(-1)^k (P^{-1}E)^k\right]P^{-1} \quad (2)$$

The VBR-LSPS preconditioner of step 52 is an approximate inverse preconditioner based on the truncated series as in Equation 2 where N is the series terms kept for the preconditioner, and where $[P]^{-1}$ is computed by first generating a LU factorization in a setup step and the forward/backward substitution step whenever the result for $\{y\}=[P]^{-1}\{x\}$ is needed.

Figure 3:
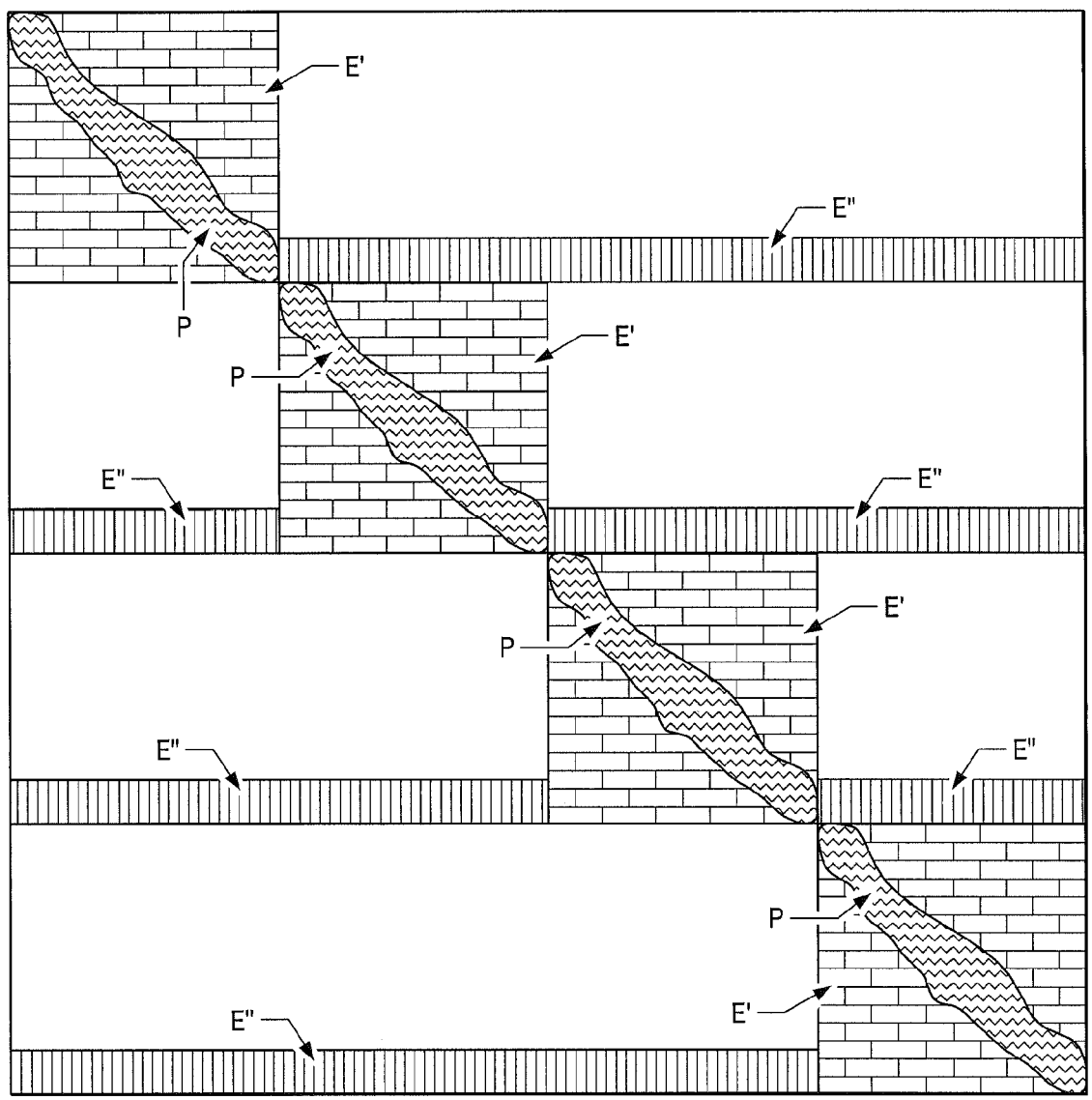
FIG. 3 is a schematic diagram of an example partitioning of matrix data for processing according to the present invention.

A data organization as a result of steps 50 and 52 for the sub-structured system matrix [A] for four subdomains is shown in FIG. 3. Parallel data is taken to be distributed memory with each domain data residing on a separate memory partition.

Figure 4A:
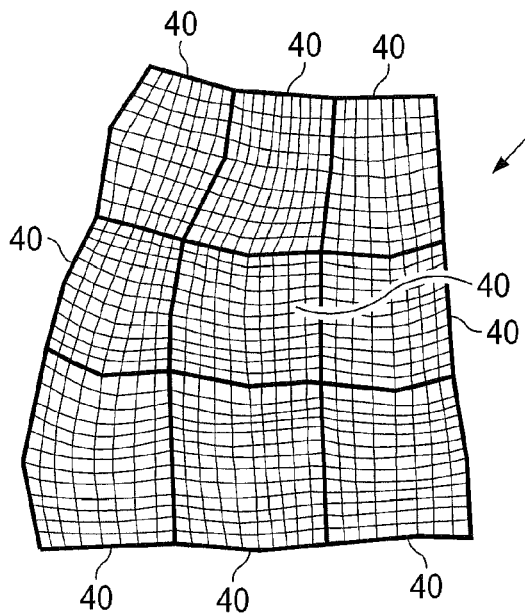
FIGS. 4A, 4B and 4C are schematic diagrams of partitioning and organization of domains of matrix data according to the present invention.

FIG. 4A is a schematic diagram showing the basic concept of the global reduced space solution methodology of the present invention. A solution domain S is shown which has been divided into nine subdomains 40 where each subdomain i contains a nearly equal amount of computational work. If the same local method and the same equation sets are used for all subdomains, this means an equal subdivision of finite volumes into each subdomain.

The methodology according to the present invention is based on a localization step 54 (FIG. 5) for parallel approximate solution of each subdomain I indicated using the chosen local preconditioner from step 50. The Matrix Equation (1) for the subdomains I can be expanded to:

$$\begin{bmatrix} A_I & B & 0 \\ C & A_B & E \end{bmatrix}_i \begin{Bmatrix} v_I \\ v_B \\ v_E \end{Bmatrix}_i = \begin{Bmatrix} R_I \\ R_B \end{Bmatrix}_i \quad (3)$$

where $A_I$ represents the matrix coefficients corresponding to the interior grid cells of the subdomain i; $A_B$ represents the matrix coefficients corresponding to the boundary grid cells of the subdomain i; B and C are connection coefficients between interior grid cells and boundary grid cells; and E are the connection coefficients between the boundary finite volumes in the subdomain i and the boundary finite volumes of all of its neighboring subdomains. The localization step 54 removes E and $v_E$ from the Matrix Equation (1) to form an independent set which can be expanded for a subdomain i to:

$$\begin{bmatrix} A_I & B \\ C & A_B \end{bmatrix}_i \begin{Bmatrix} v_I \\ v_B \end{Bmatrix}_i = \begin{Bmatrix} R_I \\ R_B \end{Bmatrix}_i \quad (4)$$

The independent set of Equation (4) for a subdomain 40 which belongs to a compute process can now be solved independently for each such subdomain during step 54 on a single process using a single thread or multiple threads without any inter-process communication.

Figure 4B:
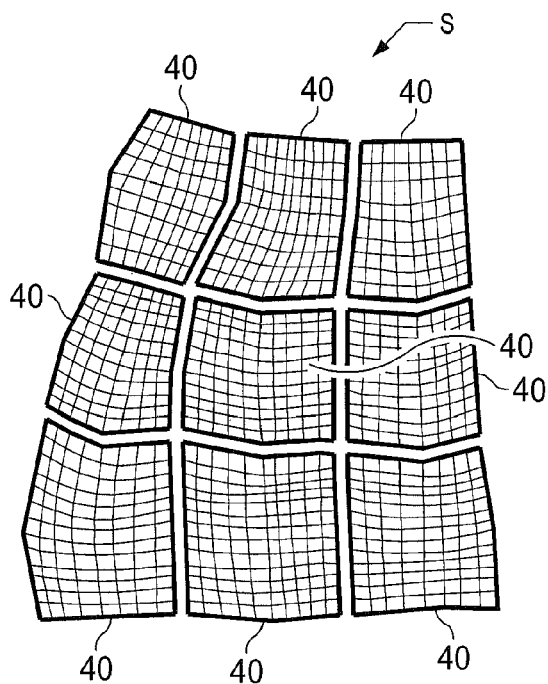

The independent parallel processing of individual subdomains 40 is illustrated schematically in FIG. 4B, where the subdomains 40 are shown separated from each other. The independent processing for individual subdomains is particularly useful in a heterogeneous system involving multi-physics where each subdomain can have different level of stiffness in the equations being solved, and the chosen local method for one subdomain may need to be a stronger method than the other subdomains.

With the present invention, a parallel independent approximate solution is thus determined during step 54 for the independent set of each of the separate subdomains via a suitable local preconditioning method based on step 50. Each process in the group can carry out this step independently from the others and can use different preconditioning methods if this is desirable. There are many robust preconditioning methods with varying strengths and computational costs which can be used during step 54. It should be understood that this local preconditioning method can also be multi-threaded to improve performance using the shared memory parallelism.

For example, if the governing equations for the simulation are elliptic, then an algebraic multi-grid (AMG) preconditioner is suitable. If the problem for the reservoir simulation is in the form of hyperbolic equations, then the incomplete LU factorization such as the ILU(k) method or the ILUT method is suitable. For a straightforward 7-point structured matrix, NF is fast and robust. If the subdomain contains very stiff equations, i.e., ones for which numerical solutions are often unstable, it might be necessary to use sparsified complete LU decomposition with pivoting locally for those equations.

For a survey of additional preconditioners, see for example, Yousef Saad, "Iterative Methods for Sparse Linear Systems", 2003, SIAM, ISBN 0-89871-534-2. Many of these methods have limited scope for good parallelization performance due to recursive algorithm or memory communication requirements. However, they are highly suitable for the local preconditioning for performing step 54 for each individual subdomain on a single compute process.

For a problem involving equations which are mixed hyperbolic-parabolic in nature as in many multiphase multicomponent flow and transport problems in porous media, the constrained pressure residual CPR method can be employed. The CPR method decouples the parabolic part from the full system and use a suitable preconditioner to generate approximate solution for the elliptic variables.

The approximate solution is then used during step 54 to precondition the full system preconditioner for solving the full-system coupled hyperbolic parabolic problem.

The CPR algorithm can be written in equation form as:

$$M_{CPR}^{-1} = M^{-1}[1 - \hat{A}CA_p^{-1}C^T] + (CA_p^{-1}C^T) \quad (5)$$

The decoupling of the pressure matrix using the CPR algorithm during step 54 permits use of the AMG multi-level solver during step 54 for the pressure variables. The global reduced space method is used to achieve near ideal scalability when generating the approximate pressure solution. The full system preconditioner can be the VBR-LSPS preconditioner which is highly scalable and robust. Alternatively, the preconditioner can be another local preconditioner such as the ILU(k) method coupled with the global reduced space method for scalable full system preconditioning.

In general, the local preconditioning step 54 can be expressed as:

$$[AM_R^{-1}M_R]_i v_i = R_i;\ [M_R^{-1}]_i \approx [A^{-1}]_i \approx \begin{bmatrix} A_I & B \\ C & A_B \end{bmatrix}_i^{-1} \quad (6)$$

where $M_R^{-1}$ is chosen such that it is easily calculated from A and the condition number cond($AM_R^{-1}$)<cond(A). The preconditioning is chosen to correctly preserve the original residuals and facilitate the application of a convergence criterion which is usually based on the relative residual norms. The relative residual norm is the ratio of a current iteration's L2 norm of the residual vector over the initial L2 norm of the residual vector.

The approximate solution of the local problem during step 54 can be written as:

$$\begin{Bmatrix} v'_I \\ v'_B \end{Bmatrix}_i = [M_R^{-1}]_i \begin{Bmatrix} R_I \\ R_B \end{Bmatrix}_i \quad (7)$$

Figure 4C:
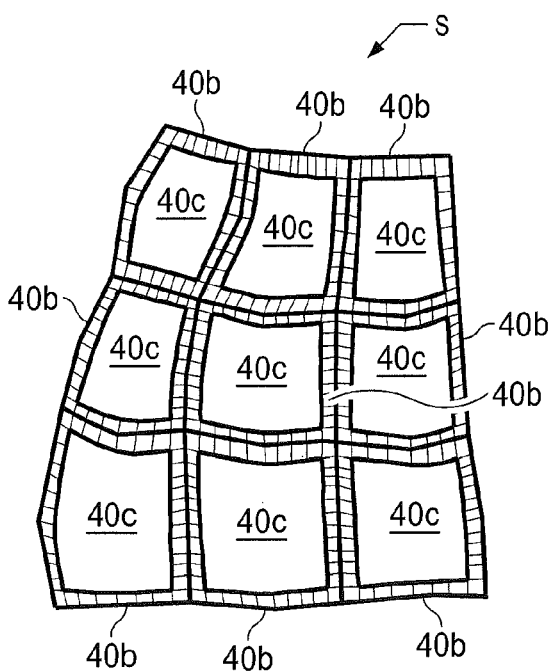

The approximate solution expressed in Equation 7 can have significant remaining errors at the subdomain boundaries which are indicated as 40b in FIG. 4C for the subdomains 40. Step 56 is next performed using the subdomain solution of Equation 7 obtained during step 54 to compute a global update of the residuals obtained during step 54. This can be written as:

$$\begin{Bmatrix} R'_I \\ R'_B \end{Bmatrix}_i = R_i - \begin{bmatrix} A_I & B & 0 \\ C & A_B & E \end{bmatrix}_i \begin{Bmatrix} v'_I \\ v'_B \\ v'_E \end{Bmatrix}_i \quad (8)$$

Step 56 involves a matrix vector multiply step, with the matrix being the full matrix and not the reduced matrix for the local subset. The vector components $v'_E$ belong to adjacent subdomains and must be transferred from the adjacent processes which own those subdomains. If this is implemented using the message passing interface MPI standard, this corresponds to a peer-to-peer asynchronous communication step. Additionally, a computation and communication overlapping can be readily implemented to achieve scalable parallel performance.

Several matrix formats can be used during step(s) 56. The present invention does not preclude the choice of matrix storage scheme. In one embodiment the distributed block spare matrix is substructured into three block CSR storage. The choice of matrix format can be flexible for the global reduced space method and can be modified to cater to a particular need of memory access and storage needs of the HPC hardware. Distributed parallel matrix data store has efficiency consequences for massively parallel implementation. The parallel data system is explained in co-pending, commonly owned U.S. patent application Ser. No. 12/876,727, "Machine, Computer Program Product and Method to Generate Unstructured Grids and Carry Out Parallel Reservoir Simulation", filed Sep. 7, 2010.

The globally updated residual vector in Equation 8 can have significant residuals clustered near the subdomain boundary as the solution of the local subdomain neglected certain contributions due to the global interactions of the solution space among all the subdomains. The parallel global-reduced-space preconditioner constructed in step 52 can now be used to address these clustered boundary residuals. The global-reduced-space matrix and the reduced-space residuals in step 58 can be constructed as follows:

$$A_{IR} = S^t \cdot A_I \cdot S \quad (9a)$$

$$F = S^t \cdot C \quad (9b)$$

$$D = B \cdot S \quad (9c)$$

$$R'_{IR} = S^t \cdot R'_I \quad (9d)$$

where S is the restriction operator and $S^t$ is the interpolation operator. The actions of S and $S^t$ are to transfer the problem in global fine space in FIG. 4a to the coarsened problem in global reduced space as in FIG. 4C. Since the purpose is to resolve the clustered boundary residuals, the space is coarsened in the interior of the domain only. Therefore, these actions are the multi-grid fine grid to coarse grid transfer operations for the matrix and the residuals between two levels.

In the simplest form, the reduced system is a single coarse cell representing the interior finite volumes 40c of the subdomain. Interior finite volumes 40c are the subset of finite volumes which do not have significant connections to finite volumes 40b in a neighboring domain, as illustrated in FIG. 4C. Many other aggregation methods can be used to generate the coarse space and are suitable for use with the present invention. A less aggressive interior coarsening may be more expensive to use but can generate a better approximation. Another strategy is to use a distance weighted aggregation from the subdomain boundary. These are all available alternatives contemplated for utilization according to the present invention.

The global reduced space matrix equation according to step 52, 58, and 60 of the form:

$$\begin{bmatrix} A_{IR} & D & 0 \\ F & A_B & E \end{bmatrix}_i \begin{Bmatrix} v''_I \\ v''_B \\ v''_E \end{Bmatrix}_i = \begin{Bmatrix} R'_{IR} \\ R'_B \end{Bmatrix}_i \quad (10)$$

During step 60, an efficient and robust parallel approximate solution vector is determined according to Equation 10 using a highly parallel global preconditioning method. This involves MPI communication among compute processes similar to the requirement for calculating the global residuals in Equation (8). During step 60, the global reduced space preconditioner seeks the approximate solution by doing a partitioning of the global reduced space system matrix $\hat{A}$ into $\hat{A} = \hat{P} + \hat{E}$, where $\hat{P}$ includes the diagonal blocks and other large coefficients in $\hat{A}$ and is the part where the inverse can be found efficiently, or a sparsified LU decomposed matrix can be computed.

The $\hat{P}$ matrix excludes all the coefficients in E. The construction of $\hat{P}$ may involve reordering of grid cells in the subdomain to generate a locally minimal bandwidth system. Then, $\hat{A}^{-1}$ is approximated as:

$$\hat{A}^{-1} \approx M_{GRS}^{-1} = [1 + \Sigma_{k=1}^N (-1)^k (\hat{P}^{-1}\hat{E})^k]\hat{P}^{-1} \quad (11)$$

Equation 11 is analogous to Equation 2, except that it is now applied during computer processing step 60 to the global reduced space system. The matrix $\hat{P}$ includes $A_{IR}$, D, F and the part of $A_B$ within the block row width of $\hat{P}$. The matrix $\hat{E}$ includes the matrix E and components from the matrices $A_B$ which are not included in $\hat{P}$. The methodology to partition $A_B$ involves the local reordering based on maximum transmissibility and a subsequent row-wise specification of the width of [P].

According to the present invention the approximate global reduced space solution to be computed with essentially a series of matrix vector multiplication steps after $\hat{P}^{-1}$ or the $\hat{P}$ factorization into the LU matrices has been computed a priori. The factorization step is carried out in the setup step 52. The global reduced space preconditioning in step 60 effectively constructs the subdomain boundary solution which is complementary to the local subdomain solution in the step 54 as the local subdomain solution did not adequately resolve the subdomain boundary residuals. The reduced space solution is then interpolated back onto the subdomain in step 62:

$$\left\{\begin{matrix} v''_{IR} \\ v''_B \end{matrix}\right\}_i = [M_{GRS}^{-1}]_i \left\{\begin{matrix} R'_{IR} \\ R'_B \\ R'_E \end{matrix}\right\}_i \quad (12)$$

Step 64 next combines the local approximate solution from step 54 as expressed by Equation (7) and the global reduced space solution from Equation (12) for such subdomain i together into a global approximate solution as follows:

$$\left\{\begin{matrix} v_I \\ v_B \end{matrix}\right\}_i = \left\{\begin{matrix} v'_I \\ v'_B \end{matrix}\right\}_i + \left\{\begin{matrix} Sv''_{IR} \\ V''_B \end{matrix}\right\}_i \quad (13)$$

The combined approximate solution update performed in step 64 as represented by Equation (13) is the solution vector which is used in step 66 to update the full residual for an iterative solver. After step 66, step 68 applies the preconditioned Krylov subspace iterative solution method. This can be a parallel implementation of one of the known, conventional ORTHOMIN, GMRES, or BICGSTAB algorithms. The local preconditioning performed at step 54 combined with the global preconditioning step at 60 significantly accelerates the convergence of the iterative solver during step 68 and typically converge difficult problems within a few Krylov subspace iterations.

During step 70, the residual resulting from performance of step 68 is examined to determine if convergence within a prescribed tolerance is achieved for a particular solver iteration i where i is simply the solver iteration counter. If not, processing returns to step 54 for continued processing in the manner set forth above. If convergence within a prescribed tolerance is determined to be achieved during step 70, the processing results and control of the data processing are returned to the reservoir simulator as indicated by step 72. The nonlinear solver of the reservoir simulator uses the solution vector to update its primary variables. This is followed by a nonlinear update of all the secondary variables and the computation of the nonlinear residual vector. If solution has not converged to within prescribed material balance tolerances and changes in the primary variables, the next Newtonian iteration is invoked. If the solution has converged, the simulator will advance to the next time step.

The present invention is particularly suited for a very large tightly-coupled system of equations which normally requires many compute nodes on currently available HPC clusters to solve. The ultra large simulation models can form a complex system of equations which are highly asymmetric and exhibit non-positive-definite block sparse matrices. The discontinuous coefficients can span over sixteen orders of magnitude.

Normally, an iterative solver would be inefficient and ineffective. The methodology of the present invention with the parallel global reduced space preconditioner described above generates a global approximate solution which uniformly reduces the system residuals in the global space. The present invention allows the Krylov solver to converge in nearly the same number of iterations as if the system has not been subdivided onto multiple compute processes in a parallel distributed fashion. The system can thus achieve very high parallel efficiency for the ultra large, difficult-to-solve problems.

Considering now the data processing system according to the present invention, as illustrated in FIG. 6, the data processing system P is provided for computerized simulation according to the present invention for massively parallel reservoir simulations. The data processing system P includes one or more central processing units or CPU's 82. The CPU or CPU's 82 which serve as cluster nodes have associated therewith a reservoir memory or database 84 for general input parameters, core sample data from wells, cell organization data and information, and data processing results. A user interface 86 operably connected with the CPU 82 includes a graphical display 88 for displaying graphical images, a printer or other suitable image forming mechanism and a user input device 90 to provide a user access to manipulate, access and provide output forms of processing results, database records and other information.

The reservoir memory or database 84 is typically in a memory 92 of an external data storage computer 94. The database 84 contains data including the structure, location and organization of the cells in the model, and data general input parameters, core sample data from wells, cell organization data and information, and data processing results for use in reservoir simulation, according to the processing methodology of FIG. 5.

The CPU or computer 82 of data processing system P includes a master node 96 and an internal memory 98 coupled to the master node 96 to store operating instructions and control information, and to serve as storage or transfer buffers as required. The data processing system P includes program code 100 stored in memory 98. The program code 100, according to the present invention, is in the form of computer operable instructions causing the master node 30 to transfer data and instructions back and forth for processing by processor nodes to simulate reservoir properties or attributes for the individual cells in the reservoir on a cell-by-cell basis, as will be set forth.

It should be noted that program code 100 may be in the form of microcode, programs, routines, or symbolic computer operable languages that provide a specific set of ordered operations that control the functioning of the data processing system P and direct its operation. The instructions of program code 100 may be stored in non-transitory form either in memory 98 or on computer diskette, magnetic tape, conventional hard disk drive, electronic read-only memory, optical storage device, or other appropriate data storage device having a non-transitory computer usable medium stored thereon. Program code 100 may also be contained on a data storage device as a non-transitory computer readable medium.

The processor nodes 102 are general purpose, programmable data processing units programmed to perform the processing of data petrophysical algorithms described above and simulate reservoir properties or attributes for the individual cells in the reservoir on a cell-by-cell basis. The processor nodes 102 operate under control of the master node(s) 82.

Computational results have been generated from simulation runs done on a 512-node (1024 CPUs at 6 cores per CPU) PC cluster. The simulation results reported are for an implementation using FORTRAN 90/95 and MPI standard for distributed memory parallelization. The CPUs are Intel Westmere CPU (Xeon-X5670) running at 2.93 GHz. The interconnect fabric is an improved QDR Infiniband switch from QLoigic. It should be understood, however, that other computer hardware may also be used. Using the FORTRAN 90/95+MPI standard communication interface, many HPC hardware which support these widely accepted high level languages and standard can be used.

For a massively parallel application, scalability of the method is very important to achieve proportionate speed-up in simulation time an increase is made in the number of compute nodes. Simulation runs for a full-field model with 28,664,550 grid cells (20,355,022 active cells) were used to illustrate the parallel scalability of the present invention. The model has 3,000 wells and the reservoir type is a fractured triple-porosity triple-permeability (TPTP) reservoir. The fluid description is three-phase black oil. The formulation is fully implicit, which means three simultaneous equations per grid cell. The simulation run covers a period of 60 years.

Figure 7:
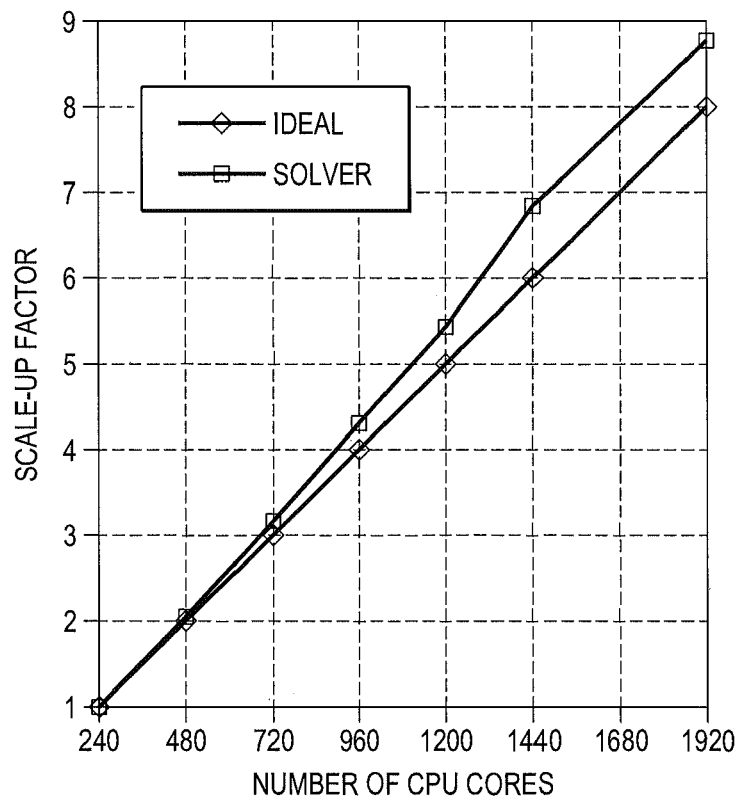
FIG. 7 is a plot of solver scalability for a simulation of a reservoir according to the present invention.

FIG. 7 illustrates the scalability plot between 240 CPU cores to 1920 CPU cores. FIG. 7 is a plot of solver scalability for a 28.7 million cell model (20.4 active) identified as Model 3 in Table 1 below which is a fractured triple porosity triple permeability model with the 3-phase black oil (BO) fluid description and using the fully implicit formulation. The test results in FIG. 7 show that up to the 1920 CPU cores used, the present invention remains in super-linear scalability. At 1920 cores, the total wall-clock time for the simulation is 1.324 hours, which is certainly acceptable for practical purposes.

The prior art simulation processes typically suffer from scalability loss and cannot practically solve a reservoir simulation problem beyond about ten million cells. For example, if a simulation processing method can achieve a parallel efficiency of 90%, which would be suitable, the maximum speed up to be expected is tenfold, regardless of how much more parallel hardware would be added. Since solver scalability is the paramount issue, it is well known in the simulation community that as the problem size increases, the percentage of overall runtime being used by the solver can reach 95+%. That is, the CPU time is completely dominated by the solver time, Table 1 below illustrates statistics of five simulation runs according to the methodology of the present invention and solver time percentage for such runs. In Table 1, BO means black-oil model, COMP means compositional, SPSP means single porosity single permeability, DPDP means dual porosity dual permeability, TPTP means triple porosity triple permeability, and Nc is the number of hydrocarbon components.

TABLE 1

| Name | Model 1 | Model 2 | Model 3 | Model 4 | Model 5 |
|---|---|---|---|---|---|
| # Grid Cells | 1,031,923,800 | 171,987,300 | 28,664,550 | 12,293,424 | 12,293,424 |
| # Active Cells | 1,031,918,940 | 171,987,300 | 20,355,022 | 5,941,741 | 5,940,515 |
| # Wells | 2,959 | 2959 | 2959 | 557 | 623 |
| Model type | SPSP | SPSP | Fractured TPTP | Fractured DPDP | Fractured DPDP |
| Fluid type | 3-phase BO | 3-phase BO | 3-phase BO | COMP, Nc = 9 | 3-phase BO |
| Duration | 60 | 60 | 60 | 52 | 42 |
| # Equations/cell | 3 | 3 | 3 | 11 | 3 |
| # CPU cores | 4,800 | 3000 | 2160 | 1,200 | 1,200 |
| Total wall time | 14.464 hrs | 6.646 hrs | 1.324 hrs | 6.736 hrs | 2.935 hrs. |
| Solver % | 58.78% | 51.99% | 50.90% | 54.15% | 53.25% |
| # Time steps | 3,074 | 3,461 | 2423 | 6,981 | 5,375 |
| # Solver iteration | 16,778 | 23,443 | 21824 | 31,715 | 78,381 |
| Time/iteration/cell-core | 8.484 μsec | 9.255 μsec | 11.79 μsec | 83.61 μsec | 14.5 μsec |

Figure 8:
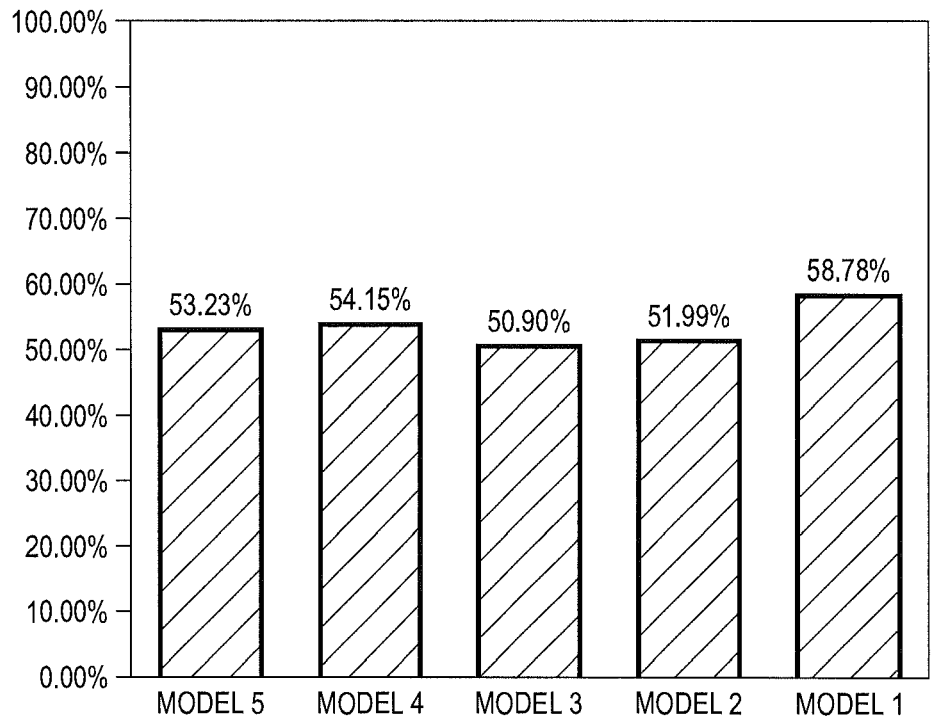
FIG. 8 is a plot simulation solver time as a percentage of overall run time for simulation runs for five types of simulation models according to the present invention.

It can be seen that for models of vastly different: sizes (from 6 million cells of Models 4 and 5, to over a billion cells of Model 1); reservoir types; and fluid types, the solver percentage remains in the range of 50% to 60%. Solver time does not increase to overwhelm the overall runtime as in the prior art. The solver percentages for the cases in Table 1 are shown in FIG. 8.

From the foregoing, it can be seen that processing methodology of the present invention provides massive parallelism, yet provides the same robustness characteristics as the strong serial methods of the prior art. The present invention can solve very difficult billion-cell multi-phase multi-component fluid flow models over several years of reservoir history and prediction simulation. The present invention can solve a wide range of simulation problems robustly with near-perfect scalability using several thousands of CPU cores.

A reservoir simulator which is programmed for distributed memory can utilize the present invention as the solution engine. The simulator can be of the type which uses either structured grids (Cartesian or CPG), unstructured grid (PEBI), or a combination of both. The stimulator can include geologic complexities such as dead cells, pinch-outs, faults and fractures. The reservoir description can be single porosity single permeability (SPSP) to multiple porosity multiple permeability (MPMP). The cell-by-cell specification of the MPMP system is the most general and includes the well-known dual porosity (DP) and dual porosity dual permeability (DPDP) system as particular instances of the system. Reservoir fluids can be multi-component multi-phase.

The global-reduced-space solution targets the subdomain boundary corrections according to the present invention. The procedure is scalable in massively parallel implementations. The global reduced space method is a grid coarsening method which focuses the solution space at the subdomain boundary. The approximate solution of the global reduced space is achieved using the highly scalable, yet robust VBR-PSLS preconditioner.

The domain interior preconditioning is achieved via a choice of robust local preconditioners such as AMG for pressure, NF, or the ILU variants for general preconditioning. Several preconditioners can be, chosen here based on the difficulties and nature of the solution space. When applied independently, these local preconditioners are well capable of effectively reducing the residuals in the interior of the subdomain. Without the global-reduced space method, significant boundary residuals remain with such local preconditioners, resulting in excessive solver iterations.

The present invention advantageously resolves the scalability issue in the massively parallel application of robust serial preconditioners which may involve algorithms with limited scope for parallelization. The present invention effectively constructs a subdomain boundary solution. The global reduced space solution and the local solution are then combined. The combined solution and the corresponding updated residual become very effective estimates in accelerating the convergence of the Krylov iterative solver typically used in reservoir simulation.

The present invention offers a unique and flexible way of achieving robust and yet highly scalable solution for the multiphase multicomponent fluid flow in porous media reservoir simulation problem. The simulator can have a simultaneous system of equations in the range of a few million to several billions. Existing solver methods break down for equation systems above about 10 million due to loss of scalability and/or loss of robustness leading to excessive iteration and hence computational costs. The present invention achieves massively parallel scalability using several thousand compute cores to solve such a coupled system efficiently. The system stays at near-perfect scalability and the iteration count does not increase.

The present invention can from the foregoing description be seen to have near-perfect scalability, permitting its use to shorten the runtime for modest size simulation models by simply increasing the number of CPU cores used to solve the problem. Since the solver method has no theoretical limit on the simulation model size, a giga-cell or billion-cell model can be constructed to obtain a high resolution model and with minimized upscaling. The problem can then be solved on a commodity-based HPC hardware with sufficient CPU cores and memory to achieve good computation turn-around time. The present invention can thus be used to overcome the model size limitations and speed limitations.

The invention has been sufficiently described so that a person with average knowledge in the matter may reproduce and obtain the results mentioned in the invention herein Nonetheless, any skilled person in the field of technique, subject of the invention herein, may carry out modifications not described in the request herein, to apply these modifications to a determined processing methodology, or in the utilization of the results thereof, requires the claimed matter in the following claims; such modifications shall be covered within the scope of the invention.

It should be noted and understood that there can be improvements and modifications made of the present invention described in detail above without departing from the spirit or scope of the invention as set forth in the accompanying claims.

What is claimed is:

1. In computer implemented simulation of fluid characteristics of a subsurface reservoir with a reservoir simulator, the fluid characteristics being governed by fluid flow, material balance and pressure-volume-temperature relationships, the reservoir being partitioned into a number of subdomains, each subdomain representing a finite volume of the reservoir containing multiphase, multicomponent fluids and being organized into a group of grid cells having data regarding the fluids, the reservoir simulation being performed in a cluster computer formed of at least one master node and a plurality of processor nodes, with each processor node being assigned a subdomain of the partitioned reservoir, a computer implemented method to simulate by Newtonian iterations fluid characteristics parameters of interest for the grid cells, a computer implemented method comprising the steps of:

arranging the data for each of the reservoir subdomains into a Jacobian matrix A composed of: a matrix P composed of the block diagonal of the subdomain and non-zero data blocks adjacent the block diagonal, a matrix E composed of non-zero data blocks not included in the block diagonal matrix P, the matrix E being composed of a matrix E' of interior grid blocks within the subdomain and a matrix E" of boundary grid cell blocks with grid cells of adjacent subdomains in the reservoir;

performing parallel approximate solutions of the fluid characteristics for the grid blocks of each of the subdomains in the assigned processor nodes using a chosen local preconditioner for the subdomain;

updating full system residuals for the Jacobian matrix for the reservoir based on the parallel approximate solutions;

restricting the full system residuals into a global reduced space according to a global reduced space matrix;

performing a parallel approximate solution of the full system residuals using a global reduced space preconditioner;

forming a combined approximate solution update in the assigned processor nodes of the parallel approximate solutions of each of the subdomains and the parallel approximate solution of the full system residuals to form a solution vector;

updating the full system residuals using the solution vector;

applying an iterative solver to the full system to obtain measures of the fluid material balances of each composition for the grid cells of the reservoir;

testing the measures of the fluid material balances of each composition obtained by applying the iterative solver to determine if convergence is achieved; and if convergence is not achieved, returning to the step of performing parallel approximate solutions; or if convergence is achieved, returning to the reservoir simulator.

2. The computer implemented method of claim 1, wherein the step of performing a parallel approximate solution results in subdomain boundary residuals, and further including the step of:

restricting the subdomain boundary residuals into a global reduced space.

3. The computer implemented method of claim 1, wherein the step of performing parallel approximate solutions to the data in the Jacobian matrix A includes the step of removing the data of the matrix E.

4. The computer implemented method of claim 1, wherein the step of updating the full system residuals comprises the step of performing matrix vector multiplication of the Jacobian matrix A and the local solution vector v for the subdomains.

5. The computer implemented method of claim 4, wherein the step of performing matrix vector multiplication for a subdomain produces residuals for boundary grid cell blocks for adjacent subdomains in the reservoir.

6. The computer implemented method of claim 5, further including the step of transferring residuals for boundary grid cell blocks from the processors for the subdomains to processors for adjacent subdomains.

7. The computer implemented method of claim 1, wherein the global reduced space preconditioner for the step of performing a parallel approximate solution of full system residuals is a global reduced space matrix $\hat{A}$ composed of a matrix $\hat{P}$ including diagonal blocks and a matrix $\hat{E}$ composed of other blocks of the matrix $\hat{A}$.

8. In a data processing system for simulation of fluid characteristics of a subsurface reservoir with a reservoir simulator, the data processing system comprising a cluster computer formed of at least one master node and a plurality of processor nodes, the fluid characteristics being governed by fluid flow, material balance and pressure-volume-temperature relationships, the reservoir being partitioned into a number of subdomains, each subdomain representing a finite volume of the reservoir containing multiphase, multicomponent fluids and being organized into a group of grid cells having data regarding the fluids, with each processor node being assigned a subdomain of the partitioned reservoir, the cluster computer simulating by Newtonian iterations fluid characteristics parameters of interest for the grid cells, the data processing system further comprising:
   a processor performing the step of arranging the data for each of the reservoir subdomains into a Newtonian matrix A composed of: a matrix P composed of the block diagonal of the subdomain and non-zero data blocks adjacent the block diagonal, a matrix E composed of non-zero data blocks not included in the block diagonal matrix P, the matrix E being composed of a matrix E' of interior grid blocks within the subdomain and a matrix E" of boundary grid cell blocks with grid cells of adjacent subdomains in the reservoir;
   the processor nodes including a processor performing the steps of:
   performing parallel approximate solutions of the fluid characteristics for the grid blocks of each of the subdomains in the assigned processor nodes using a chosen local preconditioner for the subdomain;
   updating full system residuals for the Jacobian matrix for the reservoir based on the parallel approximate solutions;
   restricting the full system residuals into a global reduced space according to a global reduced space matrix;
   performing a parallel approximate solution of the full system residuals using a global reduced space preconditioner;
   forming a combined approximate solution update in the assigned processor nodes of the parallel approximate solutions of each of the subdomains and the parallel approximate solution of the full system residuals to form a solution vector;
   updating the full system residuals using the solution vector;
   applying an iterative solver to the full system to obtain measures of the fluid characteristics for the grid cells of the reservoir;
   testing the measures of the fluid characteristics obtained by applying the iterative solver to determine if convergence is achieved; and
   if convergence is not achieved, returning to the step of performing parallel approximate solutions; or
   if convergence is achieved, returning to the reservoir simulator.

9. The data processing system of claim 8, wherein the processors in the processor nodes in performing the step of performing a parallel approximate solution results in subdomain boundary residuals, further perform the step of:
   restricting the subdomain boundary residuals into a global reduced space.

10. The data processing system of claim 8, wherein the processors in the processor nodes in the step of performing parallel approximate solutions to the data in the Newtonian matrix A perform the step of removing the data of the matrix E.

11. The data processing system of claim 8, wherein the processors in the processor nodes in the step of updating the full system residuals perform the step of matrix vector multiplication of the Newtonian matrix A for the subdomains.

12. The data processing system of claim 11, wherein the processors in the processor nodes in the step of performing matrix vector multiplication for a subdomain produce residuals for boundary grid cell blocks for adjacent subdomains in the reservoir.

13. The data processing system of claim 12, further including the processors in the processor nodes transferring residuals for boundary grid cell blocks from the processor nodes for the subdomains to processor nodes for adjacent subdomains.

14. The data processing system of claim 8, wherein the global reduced space preconditioner for the processor nodes performing a parallel approximate solution of full system residuals is a global reduced space matrix $\hat{A}$ composed of a matrix $\hat{P}$ including diagonal blocks and a matrix $\hat{E}$ composed of other blocks of the matrix $\hat{A}$.

15. A data storage device having stored in a non-transitory computer readable medium computer operable instructions for causing a data processing system during simulation of fluid characteristics of a subsurface reservoir with a reservoir simulator, the fluid characteristics being governed by fluid flow, material balance and pressure-volume-temperature relationships, the reservoir being partitioned into a number of subdomains, each subdomain representing a finite volume of the reservoir containing multiphase, multicomponent fluids and being organized into a group of grid cells having data regarding the fluids, the data processing system including a cluster computer formed of at least one master node and a plurality of processor nodes, with each processor node assigned a subdomain of the partitioned reservoir, the data processing system further simulating by Newtonian iterations fluid characteristics parameters of interest for the grid cells, the data storage device containing instructions for causing the data processing system to perform the steps of:
   arranging the data for each of the reservoir subdomains into a Newtonian matrix A composed of: a matrix P composed of the block diagonal of the subdomain and non-zero data blocks adjacent the block diagonal, a matrix E composed of non-zero data blocks not included in the block diagonal matrix P, the matrix E being composed of a matrix E' of interior grid blocks within the subdomain and a matrix E" of boundary grid cell blocks with grid cells of adjacent subdomains in the reservoir;
   performing parallel approximate solutions of the fluid characteristics for the grid blocks of each of the subdomains in the assigned processor nodes using a chosen local preconditioner for the subdomain;
   updating full system residuals for the Newtonian matrix for the reservoir based on the parallel approximate solutions;
   restricting the full system residuals into a global reduced space according to a global reduced space matrix;

performing a parallel approximate solution of the full system residuals using a global reduced space preconditioner;

forming a combined approximate solution update in the assigned processor nodes of the parallel approximate solutions of each of the subdomains and the parallel approximate solution of the full system residuals to form a solution vector;

updating the full system residuals using the solution vector;

applying an iterative solver to the full system to obtain measures of the fluid characteristics for the grid cells of the reservoir;

testing the measures of the fluid characteristics obtained by applying the iterative solver to determine if convergence is achieved; and if convergence is not achieved, returning to the step of performing parallel approximate solutions; or if convergence is achieved, returning to the reservoir simulator.

16. The data storage device of claim 15, wherein the instructions for performing a parallel approximate solution, result in subdomain boundary residuals, and further including instructions causing the data processing system to perform the step of:

restricting the subdomain boundary residuals into a global reduced space.

17. The data storage device of claim 15, wherein the instructions for performing parallel approximate solutions to the data in the Jacobian matrix A include instructions causing the data processing system to perform the step of removing the data of the matrix E.

18. The data storage device of claim 15, wherein the instructions for performing the step of updating the full system residuals comprise instructions causing the data processing system to perform the step of performing matrix vector multiplication of the Jacobian matrix A for the subdomains.

19. The data storage device of claim 18, wherein the instructions for performing the step of performing matrix vector multiplication for a subdomain produce residuals for boundary grid cell blocks for adjacent subdomains in the reservoir.

20. The data storage device of claim 19, further including instructions causing the data processing system to perform the step of transferring residuals for boundary grid cell blocks from the processors for the subdomains to processors for adjacent subdomains.

21. The data storage device of claim 15, wherein the global reduced space preconditioner for the data processing system operating under the instructions for performing the step of performing a parallel approximate solution of full system residuals is a global reduced space matrix $\hat{A}$ composed of a matrix $\hat{P}$ including diagonal blocks and a matrix $\hat{E}$ composed of other blocks of the matrix $\hat{A}$.

* * * * *

UNITED STATES PATENT AND TRADEMARK OFFICE
CERTIFICATE OF CORRECTION

PATENT NO. : 9,208,268 B2  
APPLICATION NO. : 13/765361  
DATED : December 8, 2015  
INVENTOR(S) : Larry Siu-Kuen Fung Page 1 of 1

It is certified that error appears in the above-identified patent and that said Letters Patent is hereby corrected as shown below:

In the claims

In Column 23, Line 23, Claim 16, the last word appears as "solution," and should read --solution--.

Signed and Sealed this  
Twenty-third Day of February, 2016

Michelle K. Lee  
*Director of the United States Patent and Trademark Office*